United States Patent [19]

Samson

[11] 4,132,653
[45] Jan. 2, 1979

[54] POLARIZATION ANALYZER FOR VACUUM ULTRAVIOLET AND X-RAY RADIATION

[76] Inventor: James A. R. Samson, 1600 Regency Dr., Lincoln, Nebr. 68520

[21] Appl. No.: 811,273

[22] Filed: Jun. 29, 1977

[51] Int. Cl.$^2$ ............................................. G01N 23/20
[52] U.S. Cl. .................................. 250/272; 250/372; 356/364
[58] Field of Search ............... 250/272, 273, 274, 276, 250/280, 336, 370, 505, 372; 356/114

[56] References Cited

U.S. PATENT DOCUMENTS 3,439,163   4/1969   De Jongh ..................... 250/505 X
3,903,415   9/1975   Holzapfel ..................... 250/274 X Primary Examiner—Davis L. Willis
Attorney, Agent, or Firm—Larson, Taylor & Hinds

[57] ABSTRACT

A polarization analyzer is disclosed which comprises a planar mirror mounted at an angle of incidence of 45° with respect to the radiation on a mount which is rotatable about an axis parallel to the optical axis of the radiation. A detector is also provided which is pivotably mounted with respect to the mirror such that the detector is pivotable between a first position wherein the detector detects the radiation incident on the mirror and a second position wherein the detector detects the radiation reflected by the mirror.

4 Claims, 3 Drawing Figures

POLARIZATION ANALYZER FOR VACUUM ULTRAVIOLET AND X-RAY RADIATION

FIELD OF THE INVENTION

The present invention relates in general to radiation polarization analyzers, and more particularly to polarization analyzers for radiation in the vacuum ultraviolet and x-ray region of the spectrum.

DESCRIPTION OF THE PRIOR ART

Many sources of radiation in the vacuum ultraviolet (uv) and x-ray region of the spectrum emit polarized radiation. For example, the radiation emerging from a monochromator or from a synchrotron can be highly polarized. In addition, it is often necessary to purposefully polarize radiation in order to perform specific experiments. It is thus often necessary to know precisely the degree of polarization present in a beam of radiaton. However, such measurements in the vacuum uv and x-ray spectral region are extremely difficult, since conventional transmission polarizers and analyzers do not exist for this wavelength region. Further, although the degree of polarization of radiation can, in general, be calculated from reflective measurements if the optical constants of the reflecting material are known for the wavelength in queston, such constants for vacuum uv and x-ray wavelengths are either not known, or are not known precisely enough to be reliable. In this regard, the polarization of vacuum uv radiation has been reviewed by the applicant in a work entitled *Techniques of Vacuum Ultraviolet Radiation*, published by Wiley and Sons, New York, 1967.

A reflective method has been proposed and utilized, see Rabinovitch et al., "A Method for Measuring Polarization in the Vacuum Ultraviolet", 4 *Applied Optics* 1005, August 1965, which does not require knowledge of the optical constants of the reflector. The method consists of measuring the reflectance of a mirror disposed at a 45° angle of incidence when the mirror is first oriented with respect to the optic axis such that the plane of incidence is perpendicular to the direction of maximum polarization and is then oriented parallel to the direction of maximum polarization.

Rabinovitch et al. constructed reflectometer apparatus for measuring the degree of plane polarization of the radiation beam emerging from a far uv monochromator which comprised a mirror holder with an incident angle fixed at 45° disposed within the reflectometer housing. The flange of the housing was designed for rotation of the reflectometer chamber through the various angles of interest. A photomultiplier detector sensitized with sodium salicylate was rotatable about an axis through the center of the mirror perpendicular to the plane of incidence. In other words, the detector revolved about the circumference of a circle, the center of which was coincident with the center of the mirror. In order to obtain a measure of the reflectance of the mirror, the intensity of the reflected radiation is compared with the intensity of the incident radiation. In the Rabinovitch et al. apparatus, the photomultiplier detector was first positioned to observe the reflected beam, and then it was rotated behind the mirror to be on the axis of the incident beam. The mirror was then removed to allow the incident beam to be recorded on the photomultiplier. The entire reflectometer was then rotated 90° about the flange connecting the reflectometer to the monochromator and the reflectance measurement was repeated.

The Rabinovitch et al. apparatus has a number of disadvantages which limit its utility. The apparatus is cumbersome to use. The photomultiplier is sensitive to visible and other scattered radiation and, because it is sensitized with sodium salicylate, it is otherwise unsuitable for observing vacuum uv radiation in the presence of visible and near uv radiation, as occurs with an undispersed source of He I 584 A radiation. Further, the reflected image is reversed on the detector surface, which means that any non-uniformity in the sensitivity of the detector surface will give erroneous readings.

SUMMARY OF THE INVENTION

These and other disadvantages of the prior art are overcome by apparatus constructed in accordance with the present invention, which generally comprises a planar mirror mounted at an angle of incidence of 45° with respect to the radiation on a mount which is rotatable about an axis parallel to the optical axis of the radiation. A detector is also provided which is pivotably mounted with respect to the mirror such that the detector is pivotable between a first position wherein the detector detects the radiation incident on the mirror and a second position wherein the detector detects the radiation reflected by the mirror.

In accordance with a further aspect of the invention, the detector is mounted on the mirror mount such that the detector rotates conjointly with the mirror when the mirror is rotated.

In accordance with a still further aspect of the invention, the mirror mount comprises a supporting plate on which the mirror is fixedly mounted, and the detector is mounted on a support arm which extends from the detector. The support arm is connected to a pivotable supporting bracket which is mounted on the supporting plate is spaced relationship with respect to the mirror and the supporting plate, such that the detector is disposed relatively perpendicularly and adjacent to said supporting plate when the detector is in the second position, and the detector is disposed relatively parallel to and spaced from the supporting plate when the detector is in the first position. A first drive rod is also provided which is rotatably mounted on the supportng plate and coupled by first gear means to the pivotable support bracket such that rotation of the first drive rod about the longitudinal axis thereof causes the detector to be pivoted. A second drive rod is rotatably mounted with respect to the support plate and a second gear means couples the second drive rod to the first drive rod such that the detector may be pivoted independently of the rotation of the mirror.

In accordance with a still further aspect of the invention, the supporting plate may be coupled to a rotatable drive shaft which is concentrically disposed with respect to the second drive rod.

Other features and advantages of the invention will be set forth in, or apparent from, the detailed description of a preferred embodiment found hereinbelow.

DETAILED DESCRIPTION OF THE PREFERRED EMBODIMENTS

A first, simplified, embodiment of a polarization analyzer constructed according to the present invention will be described with reference to FIG. 1. It is noted that the embodiment has been described in an article by the applicant entitled "Polarization analyzer for vacuum uv and x radiation", which appeared in *The Review of Scientific Instruments*, Vol. 47, No. 7, July 1976, at pages 859–860.

Figure 1:
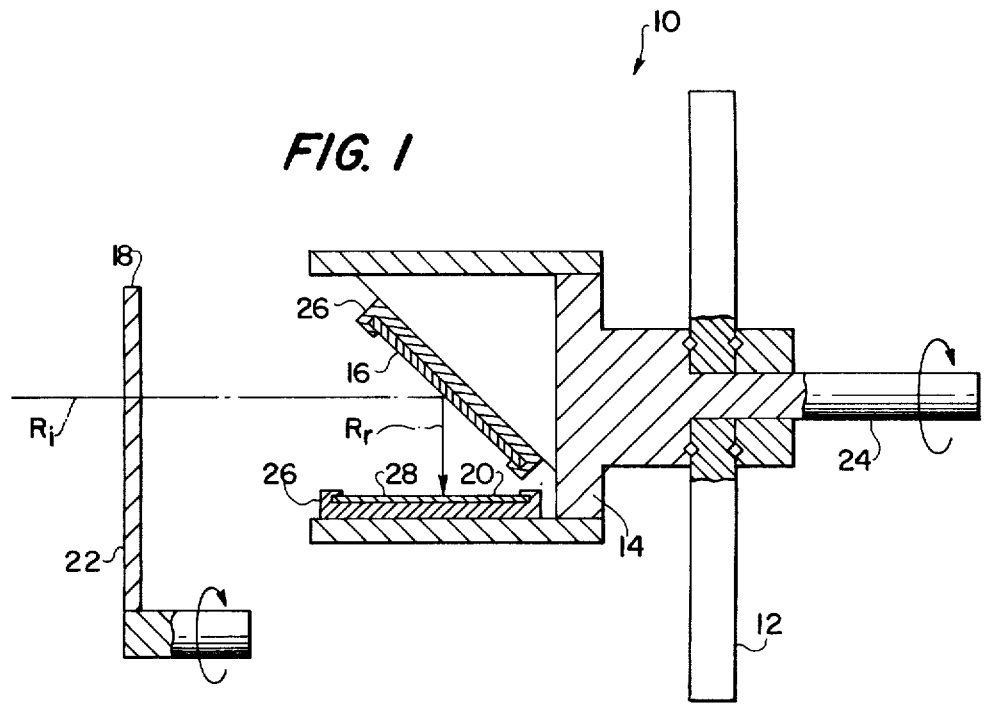
FIG. 1 is a side elevational, cross sectional view, with features omitted for purposes of clarity, of a first embodiment of a polarization analyzer constructed in accordance with the present invention.

Referring to FIG. 1, the analyzer, which is generally denoted 10, comprises an analyzer mounting 12, a support member 14 rotatably mounted on mounting 12, a mirror 16 fixedly mounted on support 14 at an angle of 45° with respect to the axis of rotation of the support 14, a first photodiode detector 18 for measuring the intensity of the incident radiation, and a second photodiode detector 20 mounted on support 14 for measuring the intensity of the radiation reflected from mirror 16.

Mirror 16 may be made by evaporating gold onto a smooth planar glass substrate. The thickness of the gold is not important, but coatings opaque to vacuum uv radiation are preferable.

Detectors 18 and 20 may be simple photodiodes made from metal or by evaporating metal onto a glass substrate. The detectors could also be channel electron multiplier arrays if greater sensitivity is required.

As shown, detector 18 may be conveniently mounted such that it may be rotated into and out of the path of the incident beam, denoted by the dashed arrow $R_i$, with the detecting surface 22 of detector 18 being substantially orthologonal to the optical axis of the incident beam. Also as shown, support 14 may be provided with a shaft 24 extending through mounting 12 so as to facilitate rotation of support 14, and thus of mirror 16, about the optical axis. Mounting 12 may advantageously be a flange for a vacuum housing, in which case vacuum seals (not shown) would be provided for shaft 24.

Mirror 16 and detector 20 are mounted on support 14 by means of insulators 26, which advantageously may be made of a flurocarbon material such as "Teflon". It is to be noted that the detecting surface 28 of detector 20 is substantially orthogonal to the optical axis of the reflected beam, which is denoted by the dashed arrow $R_r$. It is important that the incident and reflected beams strike the detecting surfaces of the respective detectors at near normal incidence because the photoelectric emission is sensitive to the angle between the plane of polarization and the detecting surfaces.

A voltage of approximately +50 volts or higher may be applied to mirror 16 by conventional means (not shown) to prevent photoelectrons ejected from mirror 16 being collected by detector 20, and to remove photoelectrons from surface 28 of detector 20, when detector 20 is a simple photodiode. A ring electrode (not shown), or the like, may be placed in front of detector 18 and held at +50 volts or more in order to remove the photoelectrons which are produced from detecting surface 22. To measure the degree of polarization of the incident radiation the reflectance of mirror 16 is measured in two orientations 90° apart. The reflectance may be obtained by taking a ratio of the signals from detector 20 to that of detector 18, with a correction factor added to correct for any differences in the relative sensitivities of the detectors. The values of the reflectance are then used in the following equation to calculate the degree of polarization:

$$P = (R_2 - R_1)/\{1 + R_1 + R_2 - [1 + 4(R_1 + R_2)]^{1/2}\}$$

where P = degree of polarization, $R_1$ = the reflectance of mirror 16 when oriented such that the plane of incidence is perpendicular to the direction of maximum polarization, and $R_2$ = the reflectance of mirror 16 when oriented such that the plane of incidence is parallel to the direction of maximum polarization.

Figure 3:
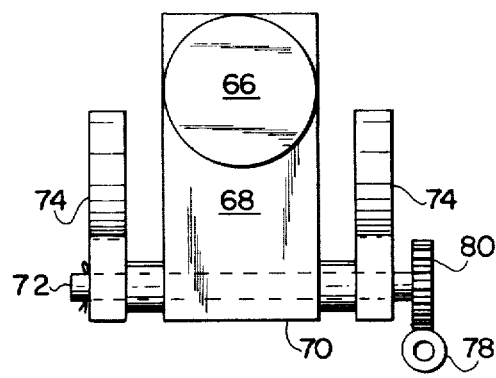
FIG. 3 is an end elevational view of a portion of the embodiment illustrated in FIG. 2.
Figure 2:
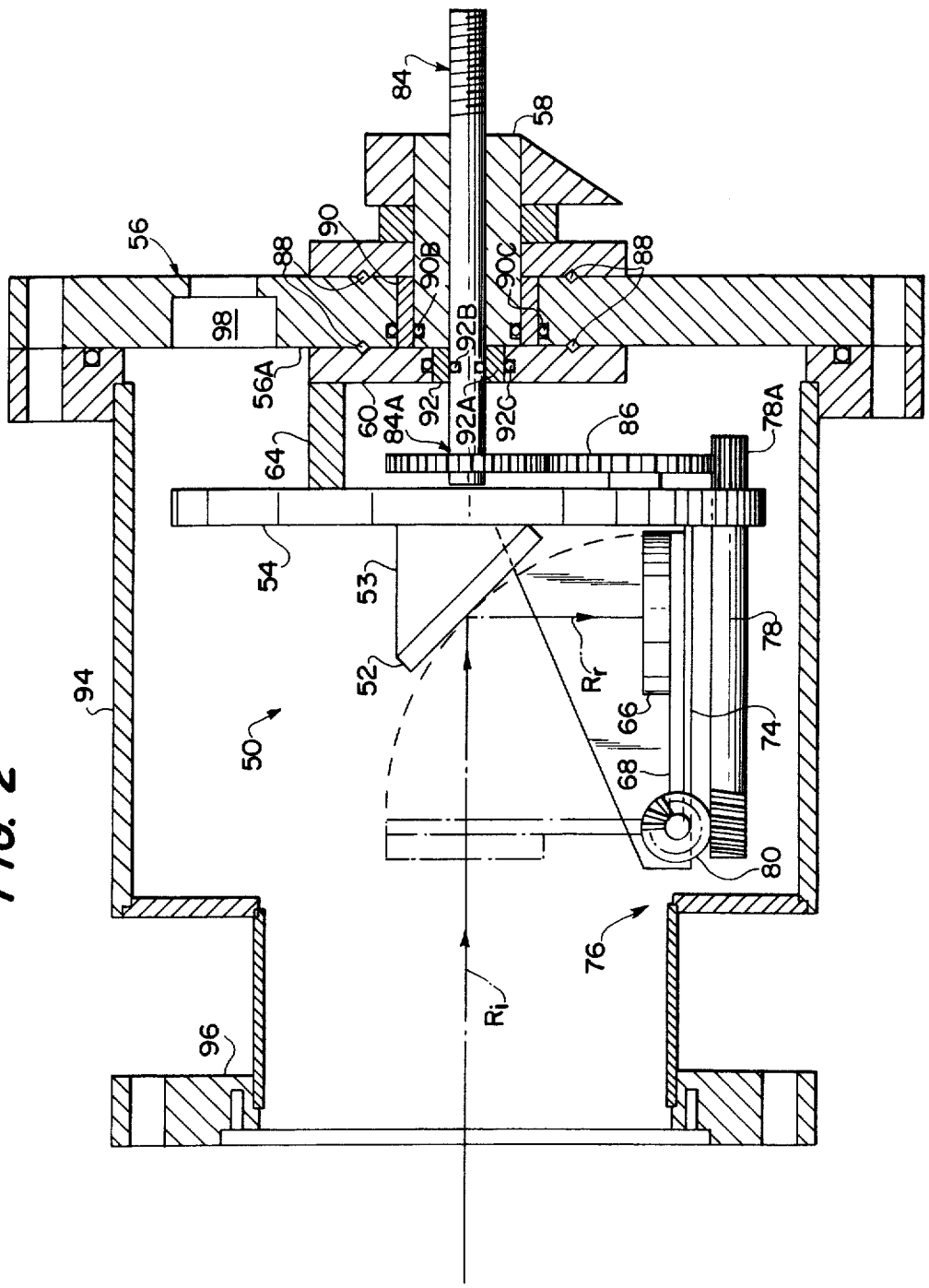
FIG. 2 is a side elevational, cross sectional view, with features omitted for purposes of clarity, of a second embodiment of a polarization analyzer constructed in accordance with the present invention.

A second embodiment of a polarization analyzer constructed according to the present invention is illustrated in FIGS. 2 and 3. The analyzer, which is generally denoted 50, comprises a mirror 52 fixedly mounted on a block 53 forming a part of a plate 54 at an angle of incidence of 45° with respect to the radiation $R_i$ to be analyzed. Plate 54 is rotatably mounted with respect to a support member 56 by means of a rotatable shaft 58 which extends through support member 56. Shaft 58 is provided with a flange 60 which abuts face 56A of member 56. Plate 54 is fixedly connected to flange 60 by a member 64 which is spaced from the axis of rotation of plate 54.

A detector 66 is mounted on a support arm 68, the end 70 of which is mounted on a pivotable support bracket 72. Bracket 72 is mounted on mounting plate 54 in spaced relationship thereto by means of members 74 such that detector 66 and support arm 68 are pivotable between a first position, shown in dashed line in FIG. 2, wherein detector 66 is disposed relatively parallel to and spaced from plate 54, so as to detect the radiation $R_i$ incident on mirror 52, and a second position, shown in solid line in FIG. 2, wherein detector 66 is disposed relatively perpendicular and adjacent to plate 54, so as to detect the radiation $R_r$ reflected by mirror 52. It is to be noted that detector 66 rotates conjointly with mirror 52 about an axis parallel to the optical axis of the radiation when shaft 58 is rotated. It is also noted that the forward member 74 (right hand member 74 in FIG. 3) has been omitted from FIG. 2 for purposes of clarity.

Means, generally denoted 76, are also provided for causing detector 66 to be pivoted between the first and second positions described hereinabove. Means 76 comprise a drive rod 78 rotatably mounted on mounting plate 54 and projecting outwardly therefrom in the direction of bracket 72, and worm gear means, generally denoted 80, coupling drive rod 78 to one end of support bracket 72, as shown, such that rotation of rod 78 about the logitudinal axis thereof causes detector 66 to be pivoted between the positions shown. Means 76 further comprises a drive rod 84 which is rotatably mounted within a longitudinal bore of shaft 58, as shown, such that rod 84 and shaft 58 have a common axis of roatation, and gear means, generally denoted 86, coupling the end 84A of rod 84 to the end 78A of rod 78, which extends through mounting plate 54, as shown, such that rotation of rod 84 will cause detector 66 to be pivoted, independently of the rotation of mirror 52 about the optical axis of the radiation.

As shown, bearings 88 may be provided to facilitate rotation of shaft 58 and rod 84. A vacuum seal 90 between shaft 58 and support member 56 and a vacuum seal 92 between shaft 58 and rod 84 are also provided for work with vacuum ultraviolet radiation. As shown, seals 90 and 92 advantageously comprise bushings 90A and 92A, respectively, and pairs of inner and outer O-rings 90B, 90C, 92B, and 92C, respectively. Referring to seal 90, O-ring 90B is fixedly mounted in a recess provided on shaft 58 and rotates therewith in sealing engagement with the inner surface of bushing 90A. O-ring 90C is fixedly mounted in a recess provided in flange 56 in sealing engagement with the outer surface of bushing 90A. Seal 92 is similar to seal 90, with O-ring 92B fixedly mounted in a recess provided on drive rod 84, and in sealing engagement with the inner surface of bushing 92A. O-ring 92C is fixedly mounted in a recess provided on the inner surface of shaft 58 in sealing engagement with the outer surface of bushing 92A. Bushings 90A and 92A advantageously may be made of a fluorocarbon material such as "Teflon". Analyzer 50 is also shown mounted in a vacuum housing, generally denoted 94, with support member 56 constituting an end wall thereof. The other end wall 96 is adapted for mounting to a source of radiation, such as a monochromator (not shown). Support member 56 may also be provided with a passage 98 which is adapted to receive a pass-through element (not shown) for electrical connections to mirror 52 and detector 66.

Detector 66 may be a metal photodiode such as that used in the embodiment of FIG. 1. When a photodiode is used for detector 66, block 53 is an insulator. For weak signals of shorter wavelength, a channel-plate, such as the channel electron arrays manufactured by Galileo Electro-Optics Corporation, or Mullard Limited, may be used.

The method of using analyzer 50 is generally similar to that for the embodiment of FIG. 1, except that detector 66 is simply pivoted into the first and second positions described hereinabove in order to intercept the incident and reflected beams. The concentric mounting of shaft 58 and detector drive rod 84 allows detector 66 to rotate rigidly with mirror 52 and to always maintain the same relative configuration with respect to mirror 52, regardless of the orientation of mirror 52 with respect to the optical axis of the radiation. An important further advantage of analyzer 50 is that the problem of image reversal on the surface of the detector, referred to hereinabove, may be obviated by rotating mirror mount 54 by 180° while detector 66 is in the first position intercepting the incident beam. This rotation allows the incident beam to strike detector 66 in precisely the same orientation as the reflected beam.

Although the invention has been described with respect to exemplary embodiments thereof, it will be understood that variations and modifications can be effected in the embodiments without departing from the scope or spirit of the invention.

I claim:
1. Apparatus for use in determining the degree of polarization of vacuum ultra-violet and x-radiation comprising
   a planar mirror,
   means for mounting said mirror at an angle of incidence of 45° with respect to radiation,
   means for rotatably mounting said mirror mounting means such that said mirror is rotatable about an axis parallel to the optical axis of the radiation,
   a detector, and
   means for pivotably mounting said detector with respect to said mirror such that said detector is pivotable between a first position wherein said detector detects the radiation incident on said mirror and a second position wherein said detector detects the radiation reflected by said mirror.

2. The apparatus of claim 1 wherein said detector mounting means is mounted on said mirror mounting means such that said detector rotates conjointly with said mirror when said mirror mounting is rotated.

3. The apparatus of claim 2 wherein said mirror mounting means comprises a supporting plate on which said mirror is fixedly mounted, and said detector mounting means comprises a support arm extending from said detector and connected to a pivotable support bracket mounted on said supporting plate in spaced relationship with respect to said mirror and said supporting plate, such that said detector is disposed relatively perpendicularly and adjacent to said supporting plate when said detector is in said second postion and said detector is disposed relatively parallel to and spaced from said supporting plate surface when said detector is in said first position, the apparatus further comprising a first drive rod rotatably mounted on said supporting plate, first gear means coupling said first drive rod to said pivotable support bracket such that rotation of said first drive rod about the longitudinal axis thereof causes said detector to be pivoted between said first and second positions, a second drive rod, means for rotatably mounting said second drive rod with respect to said support plate, and second gear means coupling said second drive rod to said first drive rod such that said detector may be pivoted between said first and second positions by rotation of said second drive rod, independently of the rotation of said mirror.

4. The apparatus of claim 3 further comprising a rotatable drive shaft coupled to said supporting plate for rotation of said mirror about the optical axis of the radiation, said drive shaft being concentrically disposed with respect to said second drive rod.

* * * * *